(12) United States Patent  (10) Patent No.: US 7,212,961 B2
Settles  (45) Date of Patent: May 1, 2007

(54) INTERFACE FOR RAPID PROTOTYPING SYSTEM

(75) Inventor: Curtis Settles, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 915 days.

(21) Appl. No.: 10/231,641

(22) Filed: Aug. 30, 2002

(65) Prior Publication Data

US 2004/0044875 A1   Mar. 4, 2004

(51) Int. Cl.
*G06F 9/455* (2006.01)
*G06F 17/50* (2006.01)
*H04L 12/66* (2006.01)

(52) U.S. Cl. .......................... 703/23; 395/500; 703/14; 370/463; 710/102

(58) Field of Classification Search .................... 703/23
See application file for complete search history.

(56) References Cited

U.S. PATENT DOCUMENTS

| | | | |
|---|---|---|---|
| 4,656,592 A | 4/1987 | Spaanenburg et al. | |
| 4,775,942 A | 10/1988 | Ferreri et al. | |
| 5,274,765 A | 12/1993 | Le Gallo | |
| 5,339,262 A | 8/1994 | Rostoker et al. ............ | 364/578 |
| 5,515,514 A | 5/1996 | Dhuey et al. | |
| 5,604,888 A * | 2/1997 | Kiani-Shabestari et al. ... | 703/23 |
| 5,804,986 A | 9/1998 | Jones | |
| 5,818,728 A | 10/1998 | Yoeli et al. | |
| 5,818,729 A | 10/1998 | Wang et al. | |
| 5,887,145 A | 3/1999 | Harari et al. | |
| 6,011,730 A | 1/2000 | Sample et al. | |
| 6,138,183 A | 10/2000 | Tien et al. | |
| 6,230,307 B1 * | 5/2001 | Davis et al. ................... | 716/16 |
| 6,266,724 B1 | 7/2001 | Harari et al. | |
| 6,289,376 B1 | 9/2001 | Taylor et al. | |
| 6,347,395 B1 | 2/2002 | Payne et al. ................... | 716/18 |

(Continued)

FOREIGN PATENT DOCUMENTS

| | | |
|---|---|---|
| JP | 61166667 | 7/1986 |
| JP | 2001134522 | 5/2001 |
| JP | 01202397 | 7/2001 |
| JP | 02202886 | 7/2002 |
| WO | WO 8803679 | 5/1988 |
| WO | WO 9525310 | 9/1995 |

OTHER PUBLICATIONS

David Flynn. 'AMBA: Enabling Reusable On-Chip Designs'. IEEE, 1997.*

*Primary Examiner*—Kamini Shah
*Assistant Examiner*—Shambhavi Patel
(74) *Attorney, Agent, or Firm*—Suiter Swantz PC LLO

(57) ABSTRACT

A method for prototyping an integrated circuit may include selecting at least one daughter card for connection to a motherboard. The daughter card is selected having an ability to provide functionality corresponding to a specific integrated circuit device. The at least one daughter card is connected to the motherboard so that the daughter card is communicatively connected to common memory provided on the motherboard. The motherboard is connected to an information handling system utilizing a prototyping interface device, the information handling system providing a virtual software modeling environment for an integrated circuit. The at least one daughter card, information handling system, prototyping interface device and motherboard emulate an integrated circuit design. At least one of software and system integration of the integrated circuit emulated by the motherboard, information handling system, prototyping interface device and the at least one daughter card is tested.

19 Claims, 16 Drawing Sheets

U.S. PATENT DOCUMENTS

| | | |
|---|---|---|
| 6,356,109 B1 | 3/2002 | Furuta et al. |
| 6,381,662 B1 * | 4/2002 | Harari et al. ............... 710/301 |
| 6,389,379 B1 * | 5/2002 | Lin et al. ...................... 703/14 |
| 6,459,136 B1 | 10/2002 | Amarilio et al. |
| 6,496,517 B1 * | 12/2002 | Gehman et al. ............ 370/463 |
| 6,893,268 B1 | 5/2005 | Harari et al. |
| 6,898,657 B2 | 5/2005 | Smith |
| 2001/0056480 A1 | 12/2001 | Taylor et al. |
| 2002/0131765 A1 | 9/2002 | DeKeyser et al. |
| 2004/0015633 A1 | 1/2004 | Smith |
| 2004/0243386 A1 | 12/2004 | Stolowitz et al. |
| 2005/0091029 A1 | 4/2005 | Traut |
| 2005/0102125 A1 | 5/2005 | Tseng |
| 2005/0182828 A1 | 8/2005 | Sheets et al. |
| 2005/0193091 A1 | 9/2005 | Taylor et al. |
| 2005/0204082 A1 | 9/2005 | Thomas et al. |

* cited by examiner

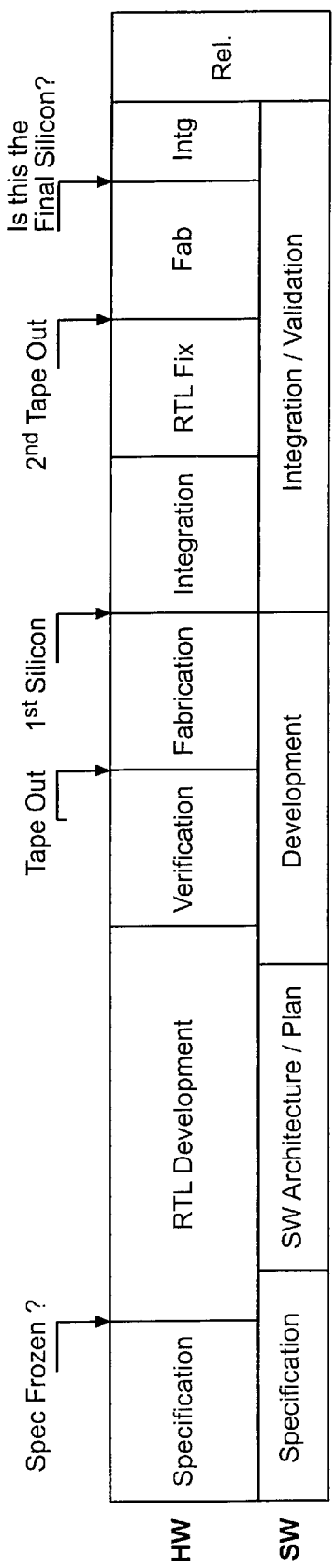
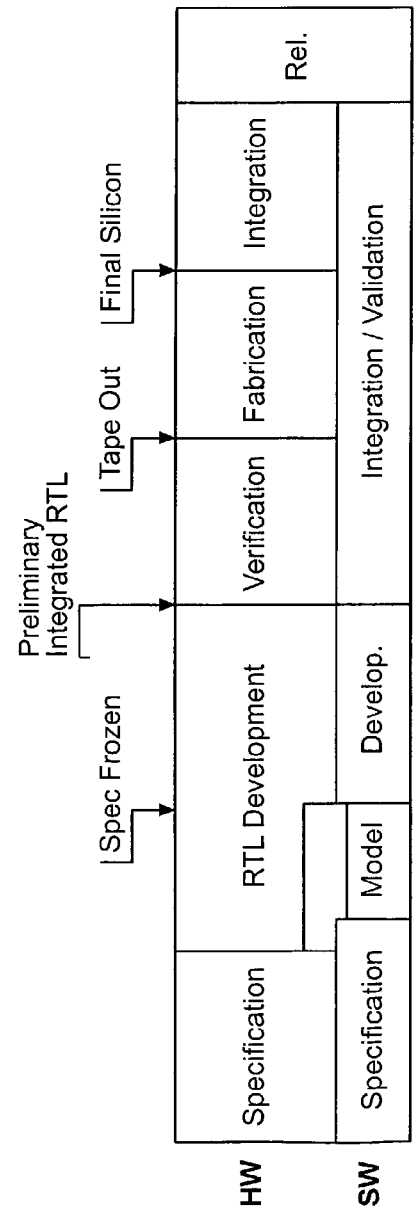
FIG._1A
FIG._1B

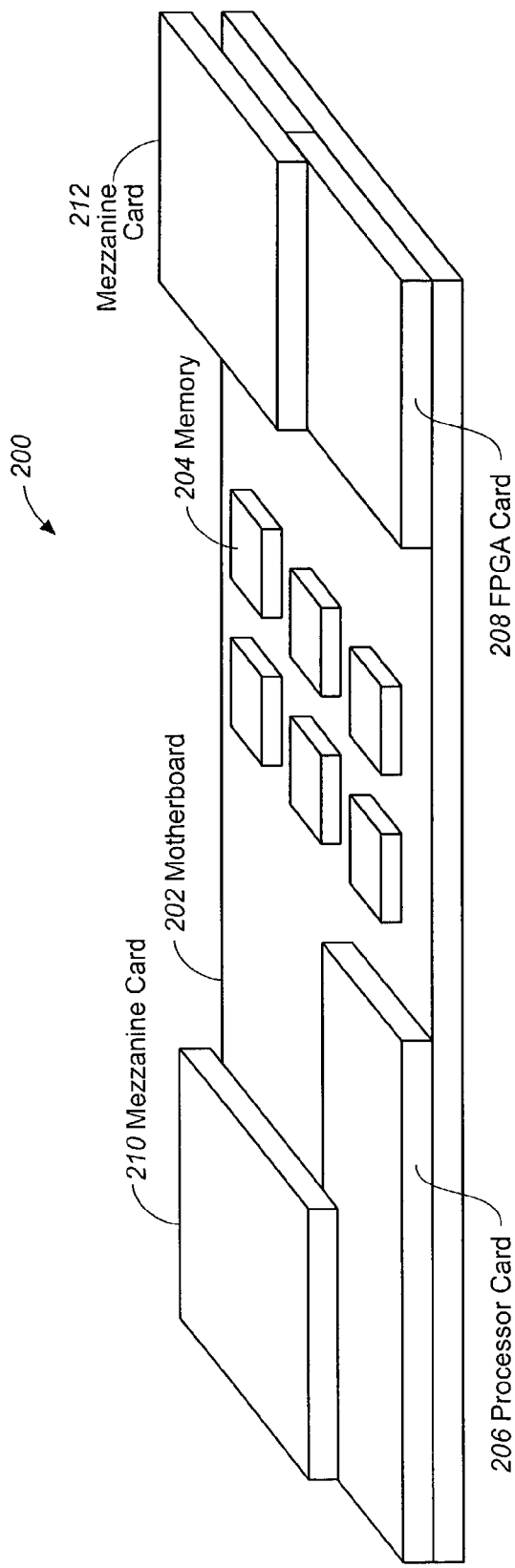
FIG._2

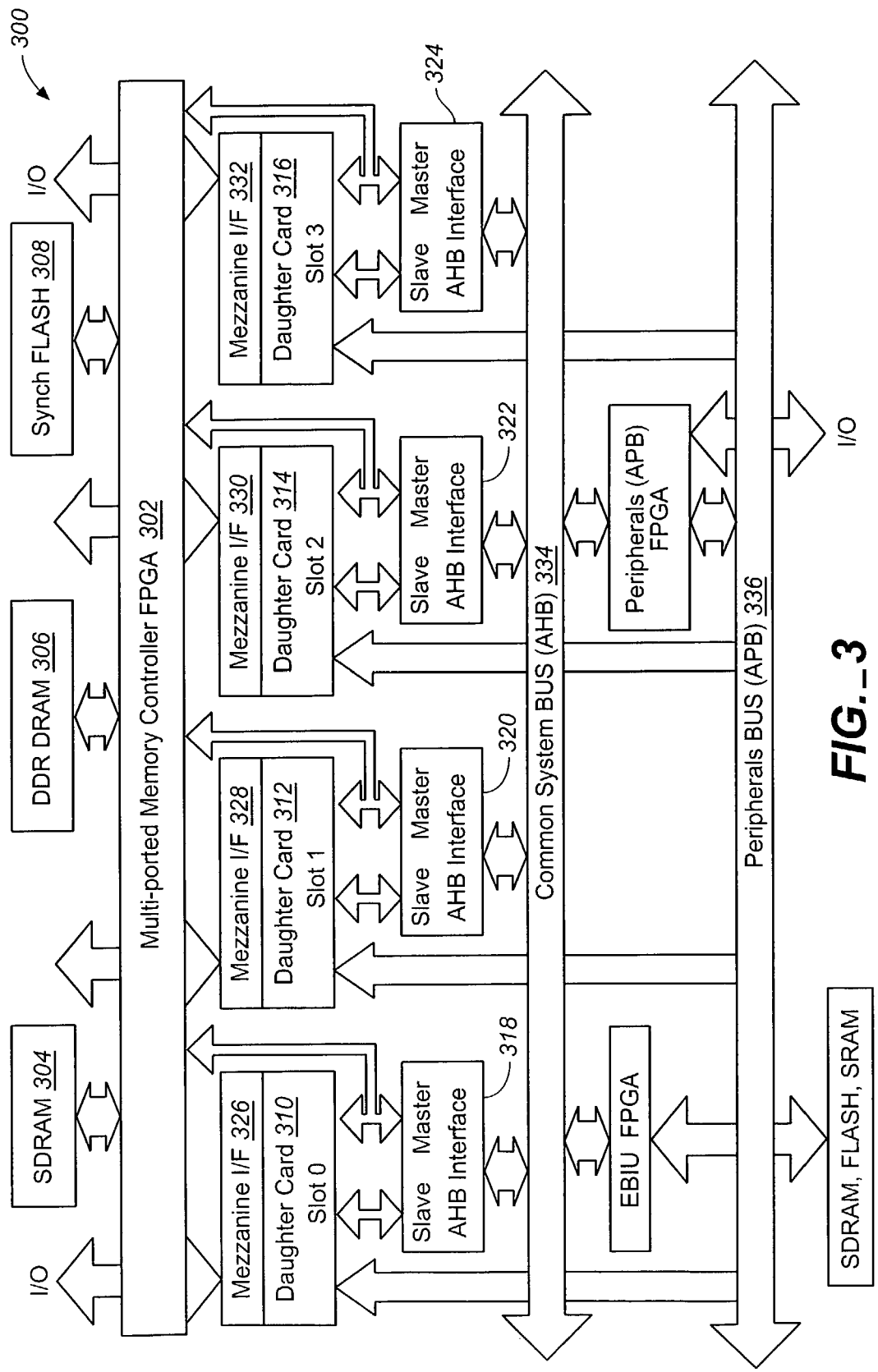
FIG._3

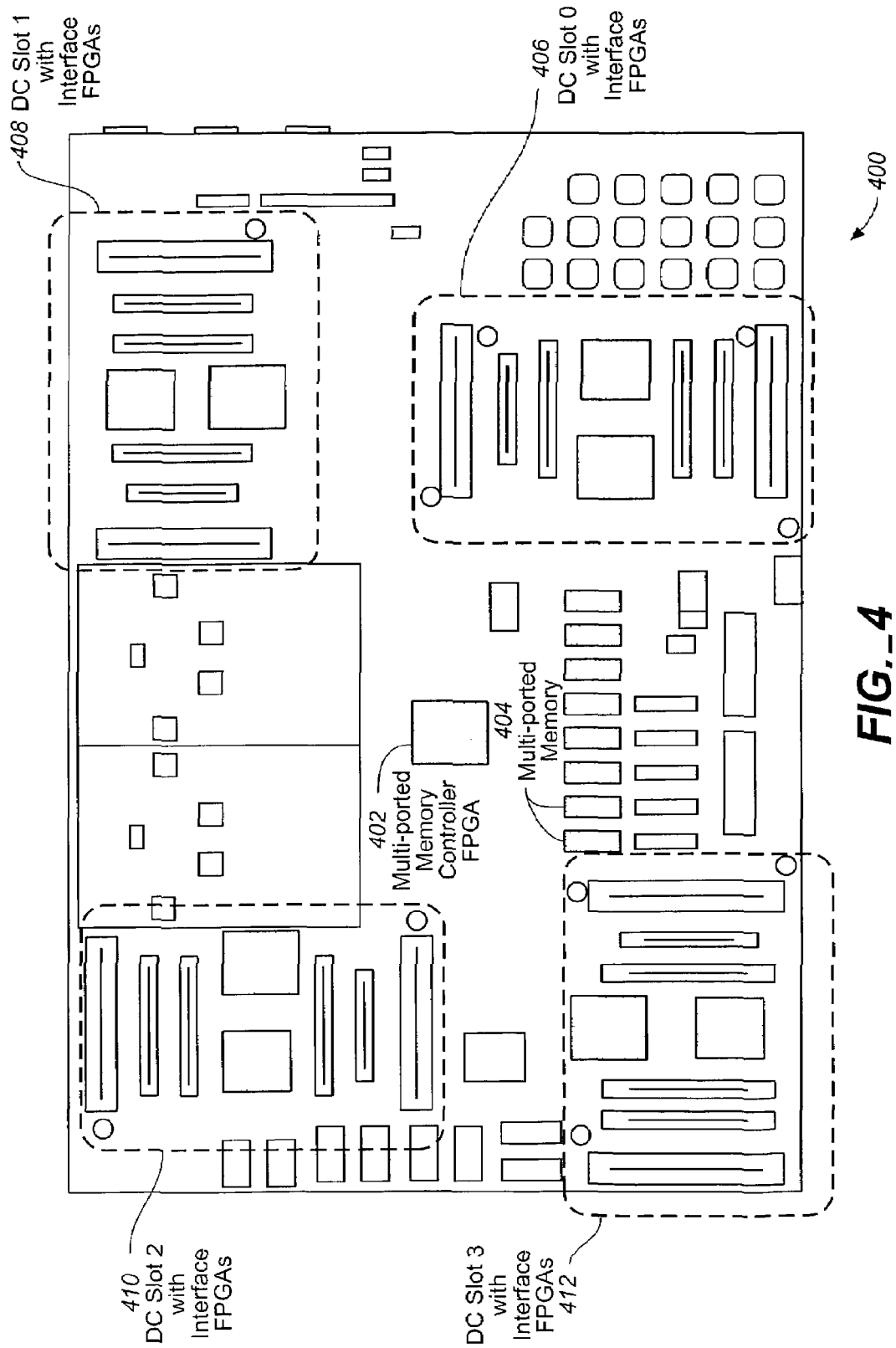
FIG._4

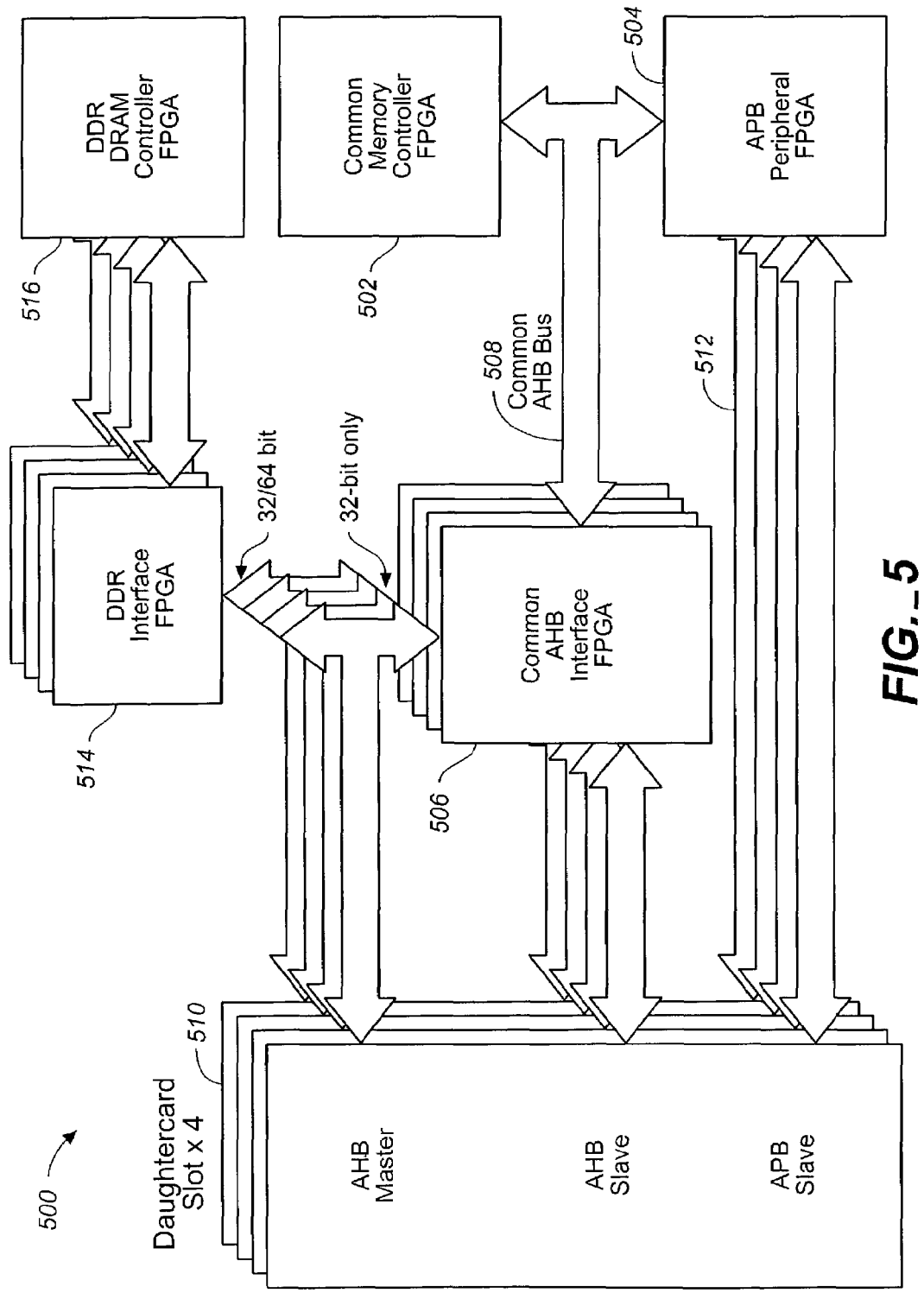
FIG._5

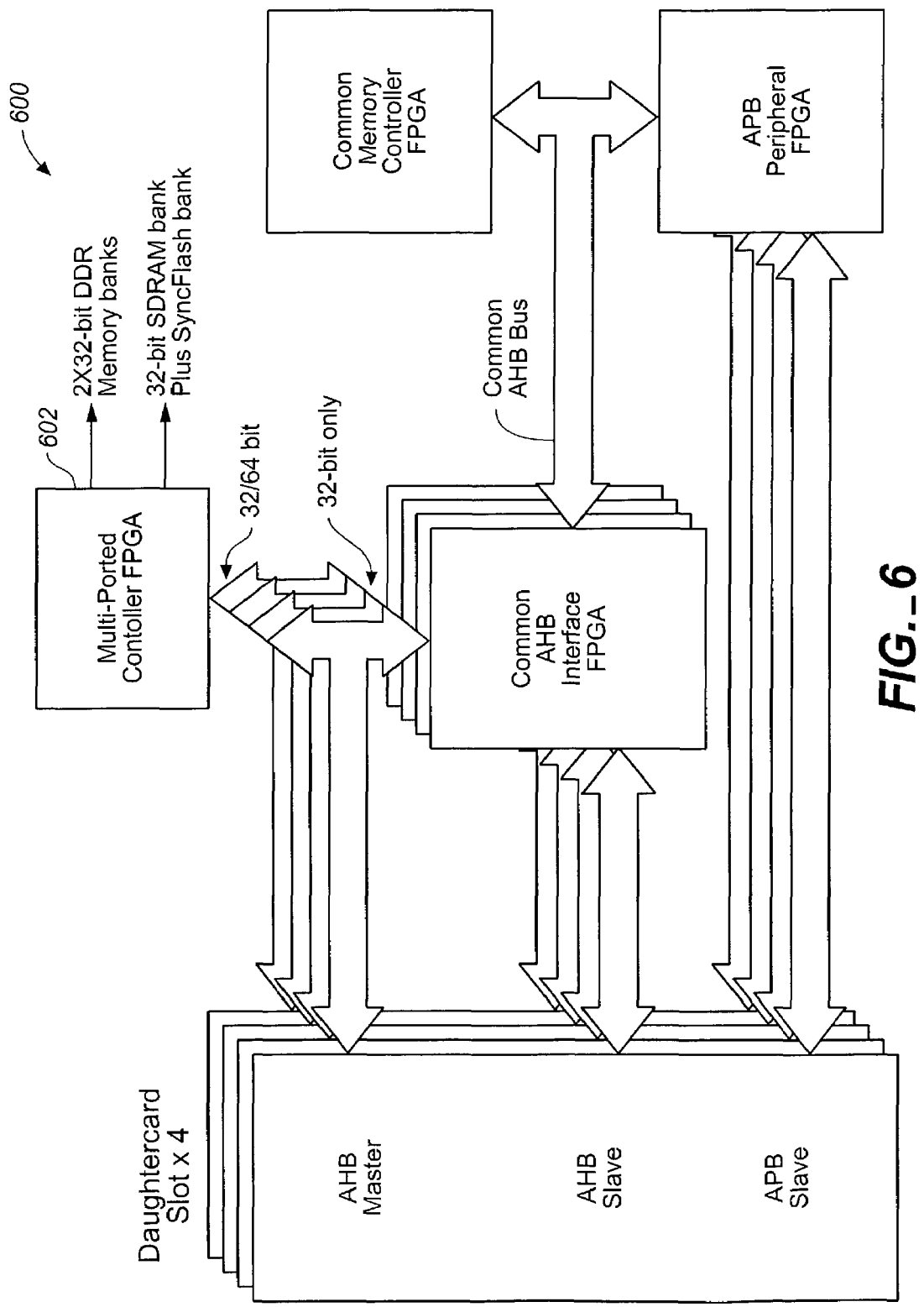
FIG._6

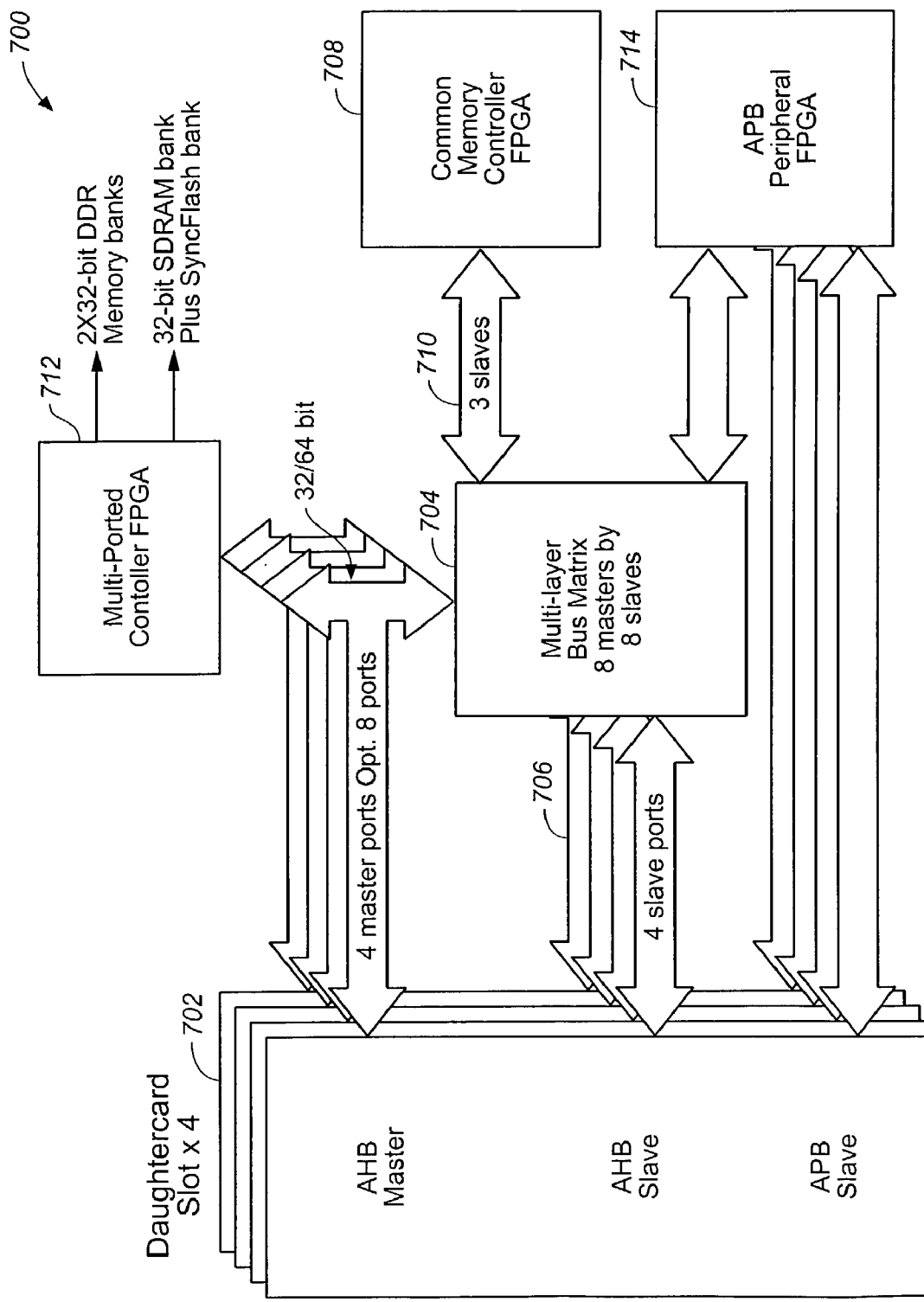
FIG._7A

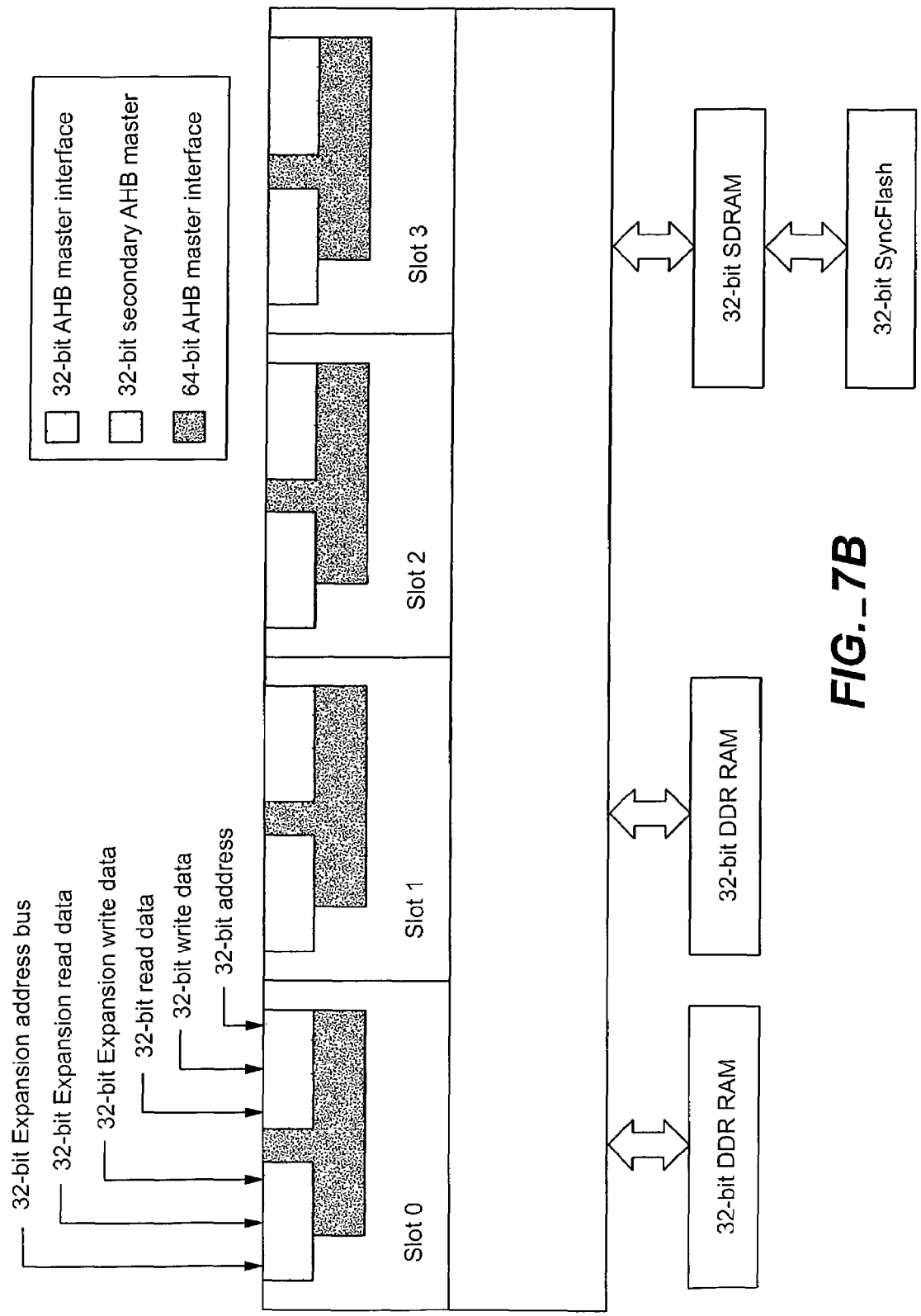
FIG._7B

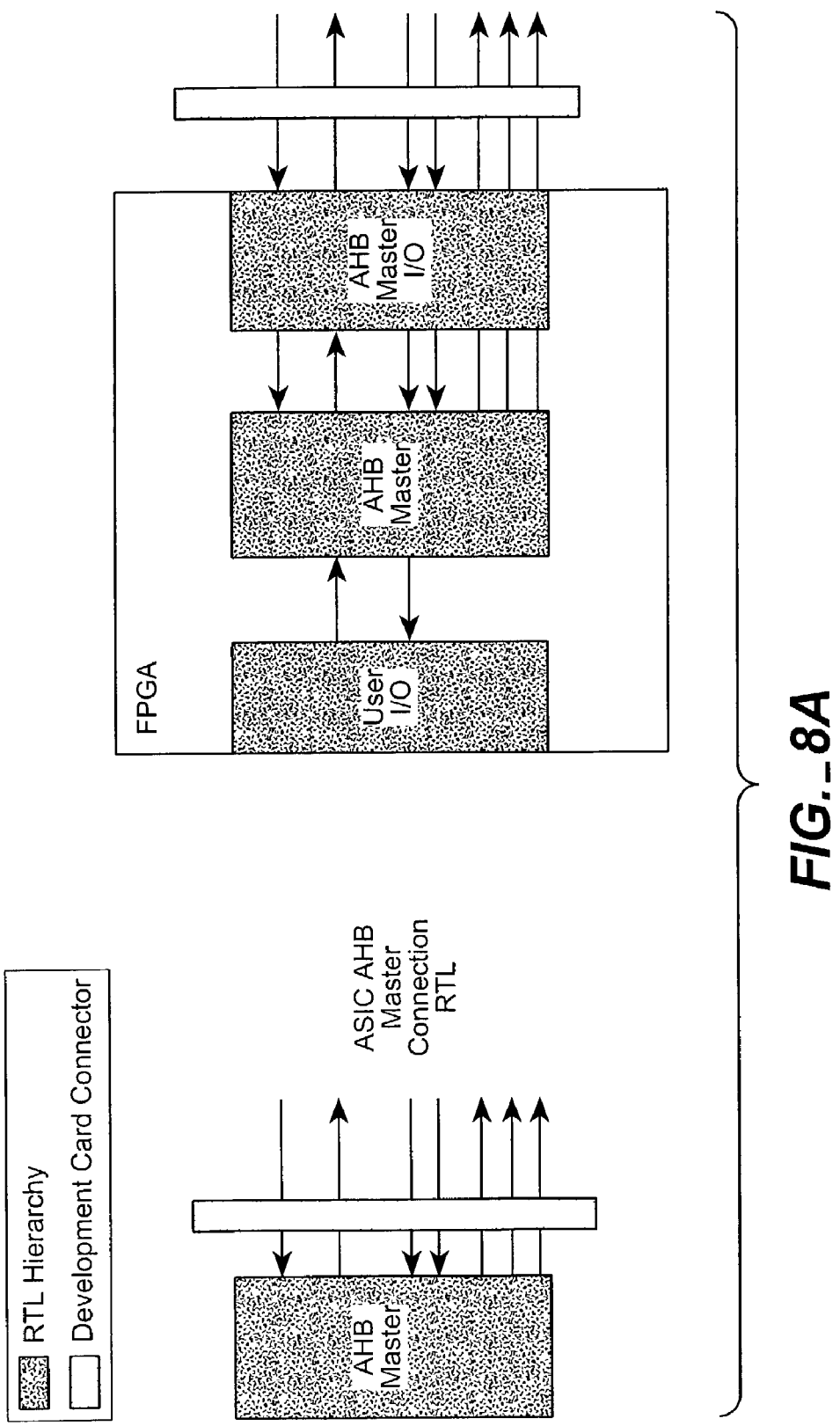
FIG._8A

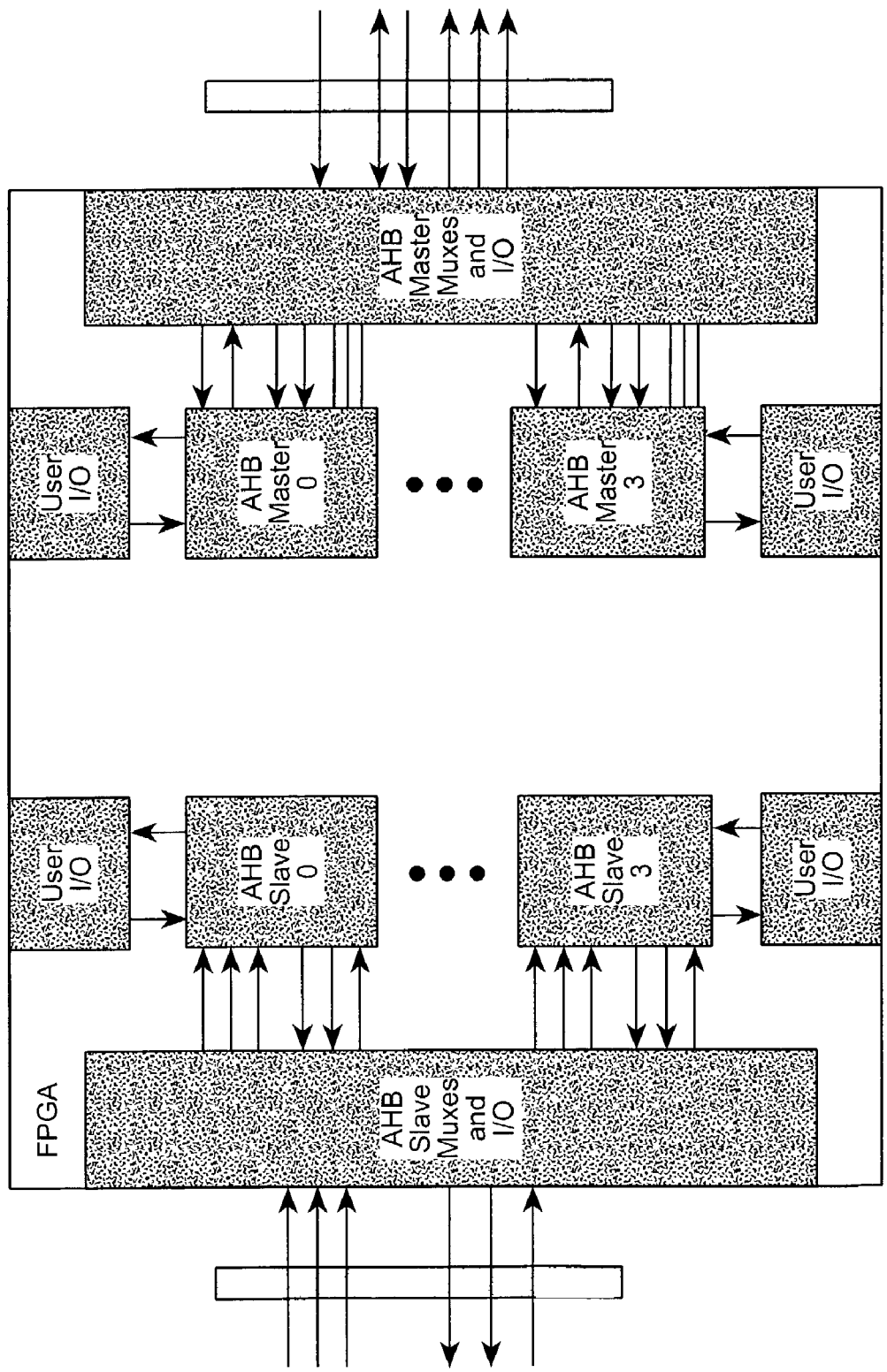
FIG._8B

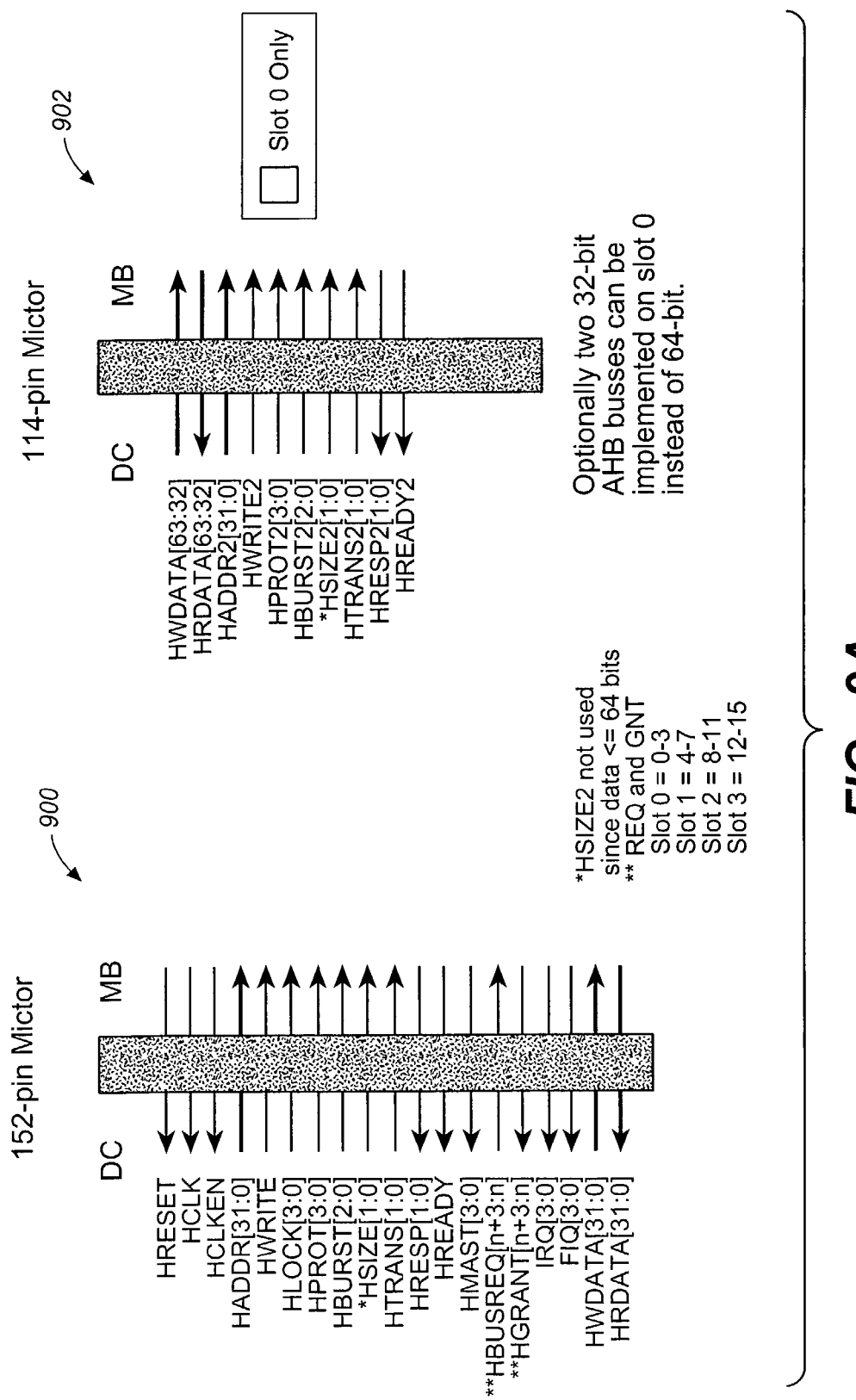
FIG._9A

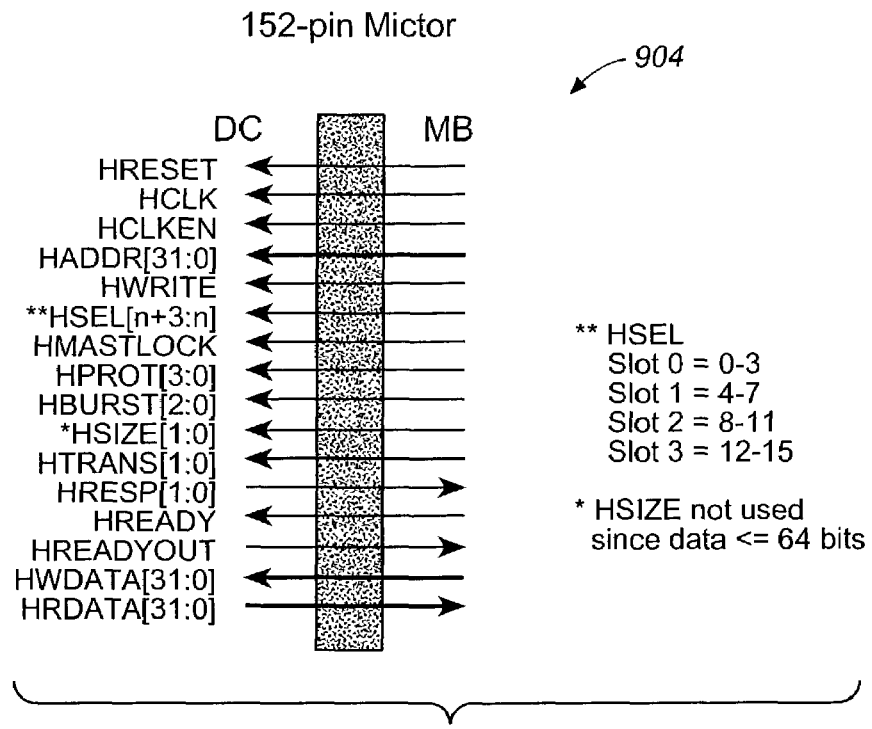
FIG._9B
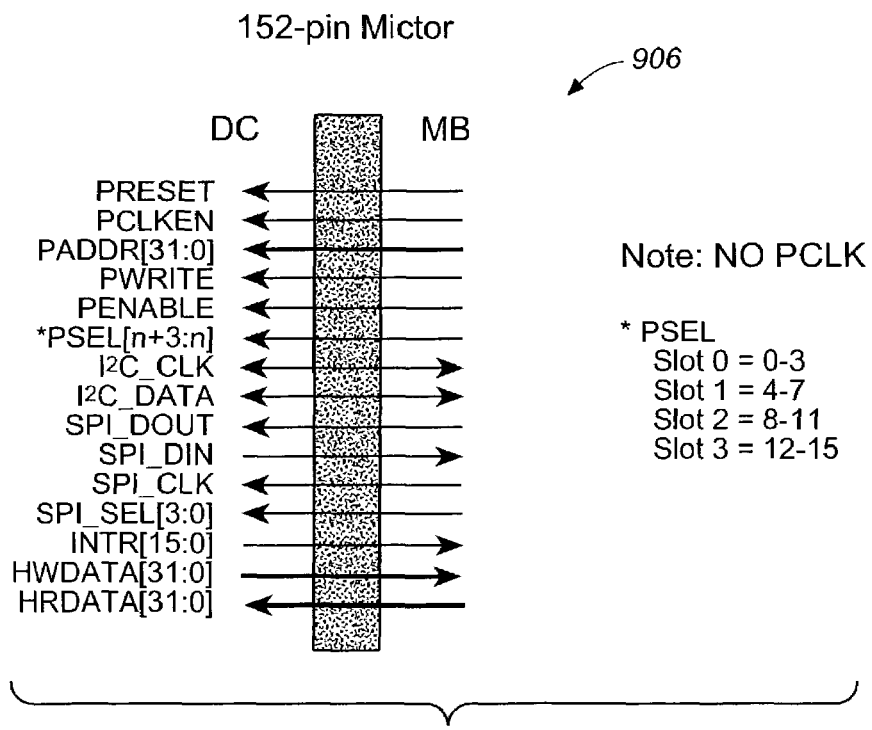
FIG._9C

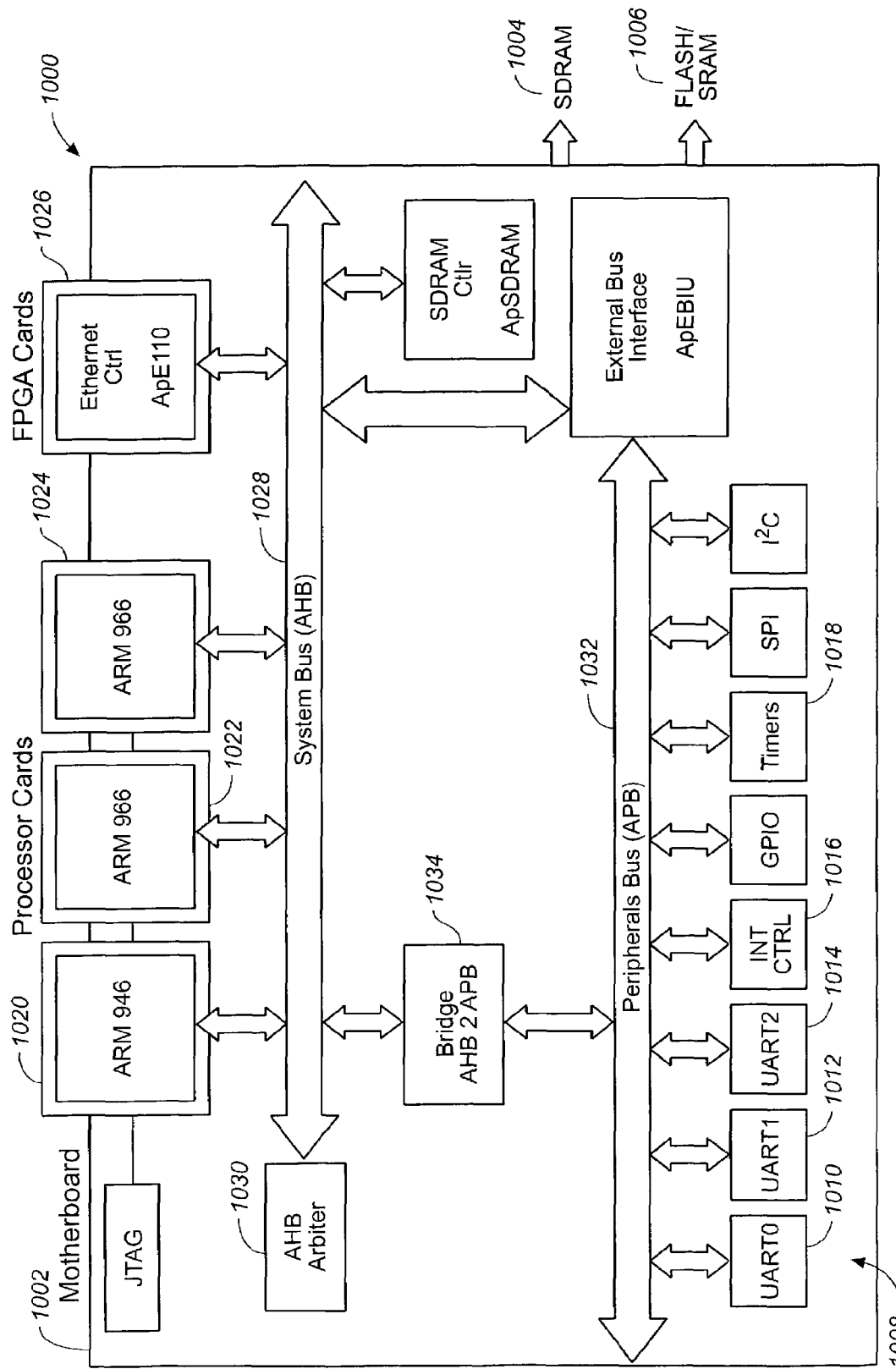
FIG._10

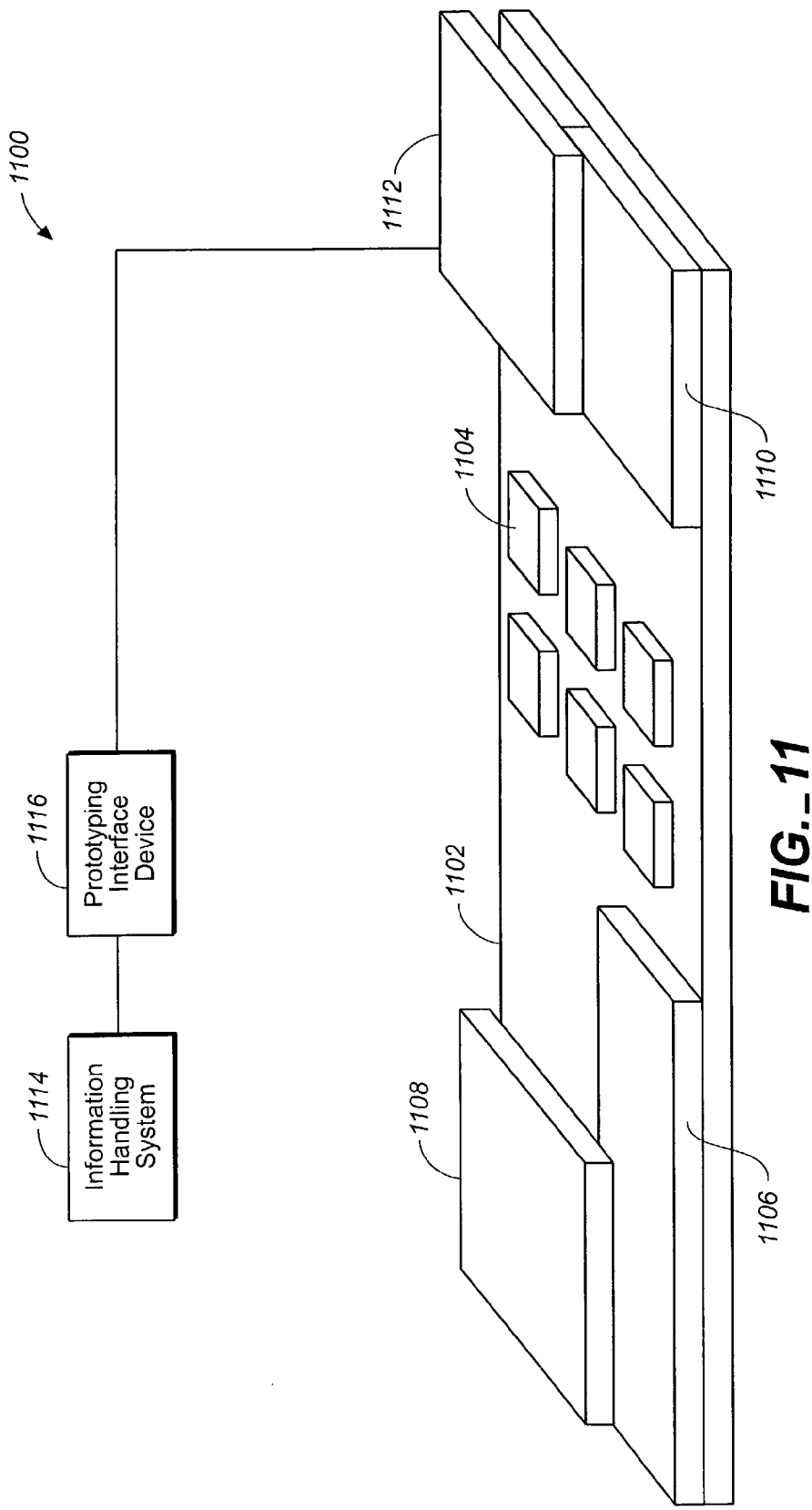
FIG._11

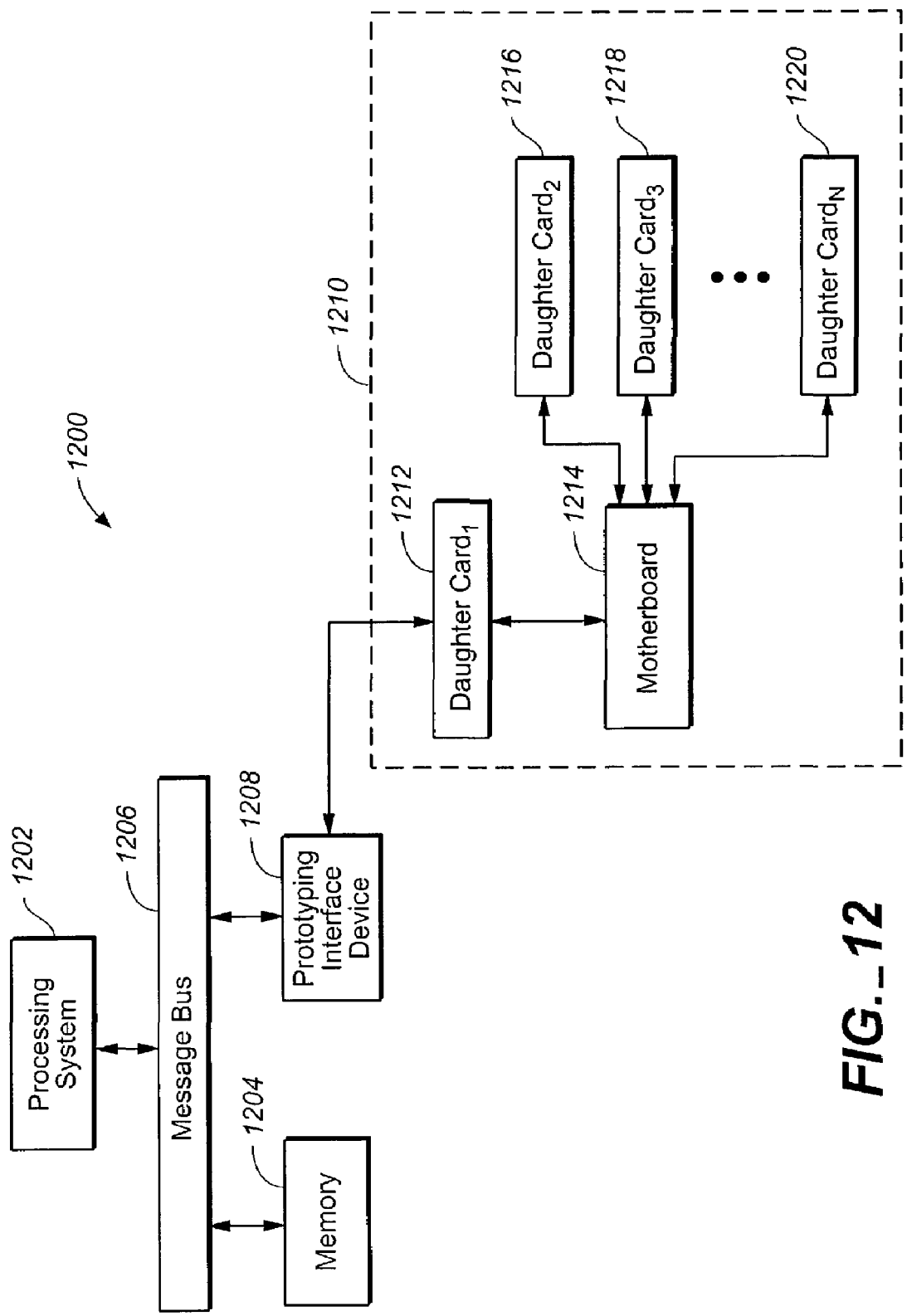
FIG._12

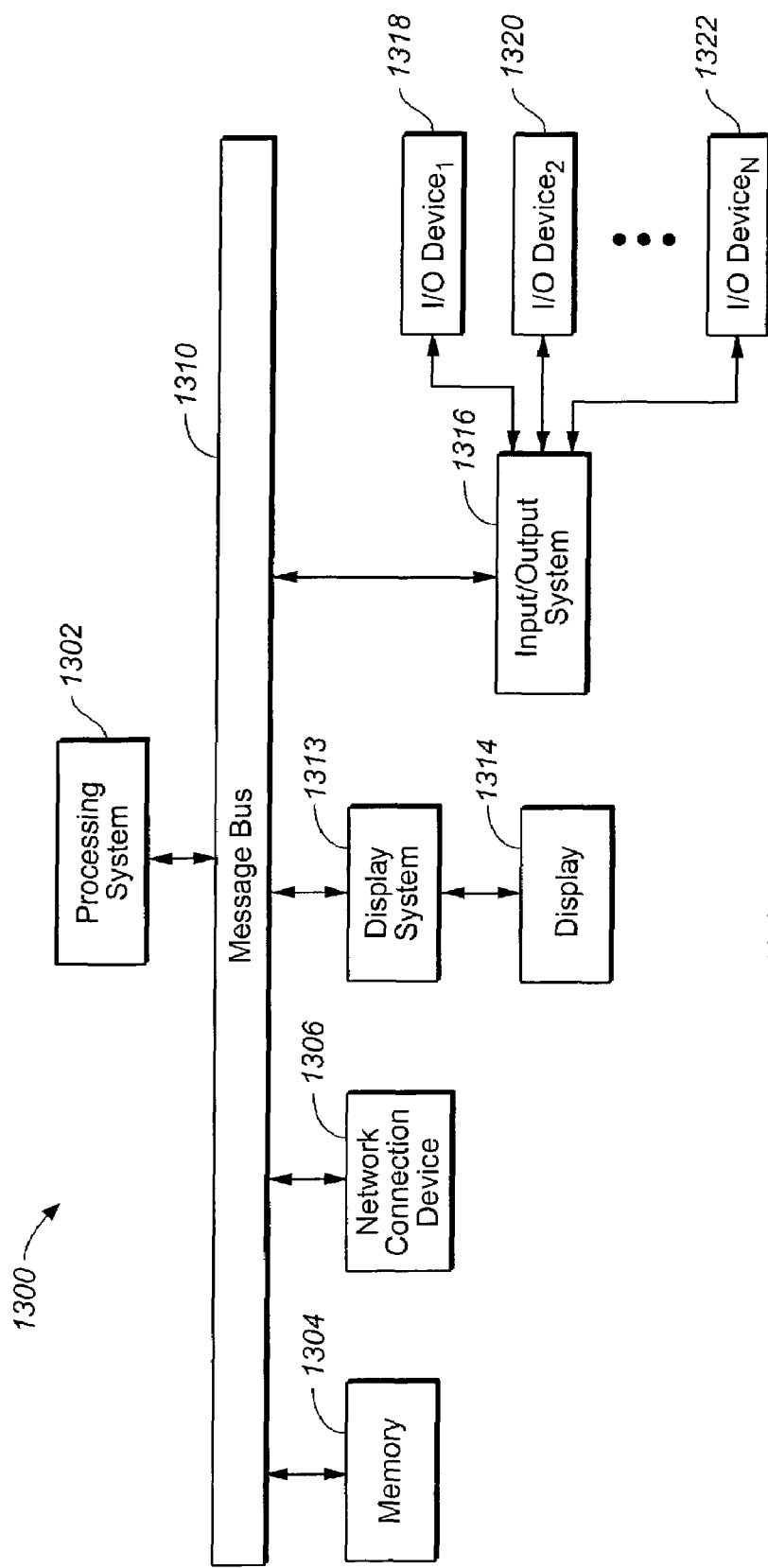
FIG._13

INTERFACE FOR RAPID PROTOTYPING SYSTEM

CROSS REFERENCE TO RELATED APPLICATION

The present application incorporates co-pending patent application titled "RAPID PROTOTYPING SYSTEM" by Curtis Settles, patent application Ser. No. 10/231,643 Filed Aug. 30, 2002, by reference in its entirety.

FIELD OF THE INVENTION

The present invention generally relates to the field of integrated circuit design, and particularly to a system, method and apparatus for a rapid prototyping and designing an integrated circuit, and specifically, an interface for a rapid prototyping system.

BACKGROUND OF THE INVENTION

Designers of integrated circuits, and especially application specific integrated circuits, are confronted with increased complexity as the number of functions provided by the circuits increase. Faster speeds, greater numbers of components, increased size of the circuit, routing issues, software development, and the like, have all contributed to the increase in integrated circuit complexity. However, as this complexity has increased, there has not been a corresponding increase in methods and systems designed to embrace this complexity. Rather designers are confronted with outdated methodologies that while sufficient for previous designs, may not take into account the issues experienced with the higher complexity devices.

For example, ASIC designs are typically late in design and therefore late to market. Much of this delay is caused by difficulty in testing the design in a system environment early enough, and the need to "spin" silicon because of inadequate system tests.

Therefore, it would be desirable to provide a system and method for rapid prototyping of an integrated circuit.

SUMMARY OF THE INVENTION

Accordingly, the present invention is directed to a system and method for rapid prototyping. In an aspect of the present invention, a system for prototyping an integrated circuit includes a motherboard, an information handling system, a prototyping interface device and a plurality of modular daughter cards. The motherboard has a plurality of connectors suitable for receiving daughter cards, the plurality of connectors being communicatively coupled to the plurality of daughter cards over a bus. The plurality of daughter cards is communicatively coupled to the motherboard utilizing the plurality of connectors. The information handling system provides a virtual software modeling environment for an integrated circuit design. The prototyping interface device is communicatively coupled to an information handling system and communicatively coupled to motherboard, the prototyping interface device including logic to translate communications between the information handling system and the motherboard. The motherboard, plurality of daughter cards, prototyping interface device and information handling system are configured as an integrated circuit emulation platform for at least one of testing software and system integration of an integrated circuit emulated by the motherboard, information handling system, prototyping interface device and the plurality of daughter cards. Accesses to resources requested in the virtual software model environment implemented on the information handling system may take place in a physical environment of the motherboard and plurality of daughter cards, and accesses to resources requested in the physical environment may take place in the virtual environment implemented on the information handling system.

In an additional aspect of the present invention, a system for prototyping an integrated circuit includes a motherboard, an information handling system, a prototyping interface device and a plurality of daughter cards. The motherboard has a plurality of connectors suitable for receiving daughter cards, the plurality of connectors being communicatively coupled to the plurality of daughter cards over a bus matching an ASIC AMBA bus environment. The plurality of daughter cards is communicatively coupled to the motherboard utilizing the plurality of connectors. The information handling system provides a virtual software modeling environment for an integrated circuit design. The prototyping interface device is communicatively coupled to an information handling system and communicatively coupled to motherboard, the prototyping interface device including logic to translate communications between the information handling system and the motherboard. The motherboard, information handling system, prototyping interface device and plurality of daughter cards are configured as an integrated circuit emulation platform for at least one of testing software and system integration of an integrated circuit emulated by the motherboard, information handling system, prototyping interface device and the plurality of daughter cards.

In an additional aspect of the present invention, a method for prototyping an integrated circuit may include selecting at least one daughter card for connection to a motherboard. The daughter card is selected having an ability to provide functionality corresponding to a specific integrated circuit device. The at least one daughter card is connected to the motherboard so that the daughter card is communicatively connected to common memory provided on the motherboard. The motherboard is connected to an information handling system utilizing a prototyping interface device, the information handling system providing a virtual software modeling environment for an integrated circuit. The at least one daughter card, information handling system and motherboard emulate an integrated circuit design. At least one of software and system integration of the integrated circuit emulated by the motherboard, information handling system and the at least one daughter card is tested.

In a further aspect of the present invention, a system for prototyping an integrated circuit includes a motherboard, a prototyping interface device, an information handling system and a plurality of daughter cards. The motherboard has a plurality of connectors suitable for receiving daughter cards and includes multi-ported memory capability as a shared resource to the plurality of connectors of the motherboard. The plurality of daughter cards are communicatively coupled to the motherboard utilizing the plurality of connectors. The information handling system provides a virtual software modeling environment for an integrated circuit design. The prototyping interface device is communicatively coupled to an information handling system and communicatively coupled to motherboard, the prototyping interface device including logic to translate communications between the information handling system and the motherboard. The motherboard, plurality of daughter cards, prototyping interface device and information handling system are configured as an integrated circuit emulation platform for at least one of testing software and system integration of an integrated circuit emulated by the motherboard, information handling system, prototyping interface device and the plurality of daughter cards.

In another aspect of the present invention, a system for prototyping an integrated circuit includes a motherboard, a prototyping interface device, an information handling system and a plurality of daughter cards. The motherboard has a plurality of connectors suitable for receiving daughter cards having a common advanced high-performance bus (AHB). The plurality of daughter cards is communicatively coupled to the motherboard utilizing the plurality of connectors. The information handling system provides a virtual software modeling environment for an integrated circuit design. The prototyping interface device is communicatively coupled to an information handling system and communicatively coupled to motherboard, the prototyping interface device including logic to translate communications between the information handling system and the motherboard. The motherboard, plurality of daughter cards, prototyping interface device and information handling system are configured as an integrated circuit emulation platform for at least one of testing software and system integration of an integrated circuit emulated by the motherboard, information handling system, prototyping interface device and the plurality of daughter cards.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 1A is a block diagram illustrating a typical development schedule;

FIG. 1B is a block diagram illustrating a development schedule with modeling and rapid prototyping of the present invention;

FIG. 2 is an illustration of an exemplary embodiment of the present invention wherein a system suitable for providing rapid prototyping is shown;

FIG. 3 is a block diagram depicting an exemplary embodiment of the present invention wherein an architecture for a rapid prototyping system is shown;

FIG. 4 is a top plan view of a system of an exemplary embodiment of the present invention wherein a motherboard suitable for use in prototyping an ASIC is shown;

FIG. 5 is a block diagram illustrating an exemplary embodiment of the present invention wherein a motherboard configuration is shown;

FIG. 6 is a block diagram illustrating an additional exemplary embodiment of the present invention wherein a motherboard configuration is shown;

FIG. 7A is a block diagram depicting an exemplary embodiment of the present invention wherein a motherboard configuration in a multi-layer board is shown;

FIG. 7B is an illustration of an exemplary embodiment of the present invention wherein a multi-ported system is shown;

FIG. 8A is a block diagram illustrating an exemplary embodiment of the present invention wherein prototyping AHB RTL in FPGAs is shown;

FIG. 8B is a block diagram depicting an embodiment of the present invention wherein multiple cores in one FPGA are shown;

FIG. 9A is a diagram of an exemplary embodiment of the present invention wherein an AHB master connectors are shown;

FIG. 9B is a diagram of an exemplary embodiment of the present invention wherein an AHB slave connector is shown;

FIG. 9C is a diagram of an exemplary embodiment of the present invention wherein an APB connector is shown;

FIG. 10 is a block diagram of an exemplary embodiment of the present invention wherein an example of mapping an ASIC onto a system of the present invention is shown;

FIG. 11 is an illustration of an exemplary embodiment of the present invention wherein a system includes a prototyping interface device having translating functionality to enable an information handling system to communicate with the rapid prototyping system utilizing system accesses;

FIG. 12 is a block diagram of an exemplary embodiment of the present invention wherein a prototyping interface device configured as a PCI card is shown; and FIG. 13 is a block diagram of a hardware system of an information handling system in accordance with an aspect of the present invention.

DETAILED DESCRIPTION OF THE INVENTION

Reference will now be made in detail to the presently preferred embodiments of the invention, examples of which are illustrated in the accompanying drawings.

Referring generally now to FIGS. 1A through 13, exemplary embodiments of the present invention are shown. The development of integrated circuits, such as general purpose integrated circuits, application specific integrated circuits (ASIC), and the like, has become more complicated as the functionality provided by the circuits increases. Faster speeds, greater numbers of components, increased size of the circuit, routing issues, software development, and the like, have all contributed to the increase in integrated circuit complexity. To address this complexity, the design process needs to become more efficient, since mechanisms and processes that may have been adequate in lower component count devices may not be sufficient when the count increases. Accordingly, the present invention is directed to a system, method and apparatus for rapid prototyping.

ASIC designs are typically late in design and therefore late to market. Much of this delay is caused by difficulty in testing the design in a system environment early enough, and the need to "spin" silicon because of inadequate system tests. However, though use of the present invention, a development system is provided which allows a design to be prototyped in FPGA and system software integrated prior to tape out of the first silicon, increasing the probably that the first silicon meets the desired requirements.

For instance, when designing an integrated circuit, both hardware and software may be developed to provide the desired functionality. Because of this co-development, an interdependency may be created between such hardware and software development so that one process may not continue until a corresponding part of the other process is developed, such as the development of a software architecture in conjunction with register transfer level (RTL) development.

For instance, previously, the development of an integrated circuit and corresponding software may go through a variety of stages, including testing, verification, and the like before a working product could be produced, an example of such a process is shown in FIG. 1A.

However, through use of the present invention, a rapid prototyping system and method is provided which enables the circuit to be designed in an efficient and time-saving manner with reduced revisions, which may result in a time saving of several months, as shown in FIG. 1B. For instance, the present invention may provide a rapid prototyping platform; ASIC emulation platform; provide early software debugging and system integration; and provide a customer demonstration platform.

Rapid Prototyping System

Referring now to FIG. 2, an exemplary embodiment of the present invention is shown wherein a system 200 is suitable for providing a rapid prototyping platform. A rapid prototyping system 200 may include a central motherboard 202 with common memory 204. Daughter cards, such as processor cards 206, FPGA cards 208, and the like may be connected to the motherboard 202. For example, the daughter cards may be connected through an advanced microcontroller bus architecture (AMBA) advanced high-performance bus (AHB) to the motherboard to provide specific desired functionality. Additionally, the daughter cards may include mezzanine cards 210 & 212 for physical I/O connectivity, i.e. physical interfaces, for the daughter cards. The daughter cards may utilize similar connects as utilized by the daughter card to the motherboard, and the like without departing from the spirit and scope of the present invention. Preferably, the specifications are standardized to enable a user to design and interchange components of the system, thereby providing a modular development system.

In this way, a standardized advanced microcontroller bus architecture (AMBA) based rapid prototyping vehicle may be provided. The system may be a configurable FPGA-based system which is extendable to support multiple cores and interfaces. Preferably, the system is processor independent and is thus suitable for supporting multi-instruction processing system (MIPS), advanced RISC machine (ARM), ZSP, and the like. The system may also support a common mechanical and electrical form factor and specification so that the system is customizable to meet application specific needs and extensions, which may be designed in an efficient and intuitive manner by a circuit designer. Thus, the system of the present invention may enable the ready and efficient prototyping of integrated circuits, and even the wide range of functionality desired in application specific integrated circuits.

The present invention enables rapid prototyping and reductions in development and integration time. For instance, the present invention may provide an early hardware debugging and software development platform. Additionally, as previously mentioned the present invention provides a custom CPU option due to processor independence and enables multi-processor system prototyping and debugging. Thus, the present invention may be configured to add customer logic and application specific functions. Further, the present invention demonstrates FPGA prototyping methodology flow for ASIC IP.

Referring now to FIG. 3, an exemplary embodiment of the present invention is shown wherein an architecture 300 for an ASIC-on-a-board suitable for rapid prototyping is illustrated. A motherboard includes a multi-ported memory controller 302 communicatively coupled to common memory, which may include SDRAM 304, DDR DRAM 306, synch flash 308, and the like. For example, 128 MB of multi-ported memory, 32 MB SDRAM, 2 MB SRAM and 8 MB of flash memory may be provided. The multi-ported memory controller may be implemented in a FPGA to provide flexibility of the design.

A plurality of daughter cards 310, 312, 314 & 316 are communicatively coupled to the multi-ported memory controller 302 through advanced high-performance bus interfaces 318, 320, 322 & 324. For example, a motherboard may include daughter card (DC) slots which have 32-bit AHB interfaces, which support four AHB masters, four AHB slaves and four APB slaves. The daughter cards 310, 312, 314 & 316 may each include a mezzanine card 326, 328, 330 & 332 to provide an interface.

The advanced high-performance bus interfaces 318, 320, 322 and 324 are communicatively coupled over a common system bus 334, which may include an advanced high-performance bus, for communication between the daughter cards 310, 312, 314 & 316. A peripherals bus, such as an advanced peripheral bus (APB) 336, may also be provided to link peripherals to the daughter cards 310, 312, 314 and 316.

Although four daughter cards are shown, it should be apparent that a wide number of daughter cards may be utilized in conjunction with the present invention without departing from the spirit and scope thereof. Moreover, although an advanced high-performance bus (AHB) is described, a variety of bus architectures are contemplated by the present invention, such as DDR FPGA and the like.

Motherboards

A view of a motherboard 400 of an embodiment of the present invention is shown in FIG. 4. The motherboard 400 includes multi-ported DDR memory controller implemented in a FPGA. Memory 402 which is onboard the motherboard may include multi-ported memory, SDRAM, SRAM, Flash, and the like, as previously described in relation to FIG. 3. Four daughter card (DC) slots 406, 408, 410 & 412 are provided for linking with daughter cards. The daughter card slots 406, 408, 410 & 412 may include 32-bit AHB interfaces which support four AHB masters, four AHB slaves and four APB slaves. The daughter card slots 406, 408 410 & 412 may also include a stand-alone AHB subsystem, such as a ZSP subsystem, and interface to a common AHB bus. Preferably, a dedicated memory port interface is also included, such as to a 64-bit DDR memory.

As described with regards to FIG. 3, the motherboard shown in FIG. 4 is not restricted to an AHB interface, it is contemplated that a wide variety of interface may be utilized without departing from the spirit and scope of the present invention. In this way, a modular daughter card is provided which supports multilayer AHB designs.

Referring now to FIG. 5, an exemplary embodiment of the present invention is shown wherein a motherboard 500 configuration of the present invention is illustrated. The motherboard 500 includes a common memory controller 502 implemented through a FPGA communicatively coupled to an APB peripheral FPGA 504 and a plurality of common AHB interface FPGAs 506 over a common AHB bus 508. A plurality of daughter cards 510, in this instance four, are also included, which have an AHB master, AHB slave and APB slave interfaces. The daughter cards 510 are linked to the APB peripheral FPGA 504 utilizing the APB slave connected to a peripheral bus 512. The daughter cards 510 are also linked to the common AHB interface FPGA 506 and a DDR interface FPGAs 514 through use of an AHB master.

The DDR interface FPGAs 514 are communicatively coupled to a DDR DRAM controller FPGA 516.

An additional embodiment of a motherboard 600 of the present invention is shown in FIG. 6. In this embodiment, a multi-ported controller FPGA 602 is utilized, which is coupled to two 32 bit DDR memory banks, a 32 bit SDRAM bank and a syncflash bank. The rest of the architecture is substantially similar to the architecture of a motherboard of the present invention described in relation to FIG. 5.

Referring now to FIG. 7, an exemplary embodiment of the present invention is shown where a multi-layer motherboard 700 is shown. The multi-layer motherboard 700 includes four daughter card slots 702, each having an AHB master, AHB slave and APB slave. The daughter card slots 702 are communicatively coupled to a multi-layer bus matrix 702 having eight masters and eight slaves by utilizing four slave ports 706. The multi-layer bus matrix 704 is communicatively coupled to a common memory controller FPGA 708 utilizing three slaves 710.

The daughter card slots 702 are also communicatively coupled to the multi-layer bus matrix 704 utilizing the AHB master, as well as to a multi-ported controller FPGA 712. The multi-ported control FPGA 712 is coupled to two 32 bit DDR memory banks and a 32 bit SDRAM bank, plus a syncflash bank. An APB peripheral FPGA is also included, which is coupled to the multi-layer bus matrix 704, as well as the daughter card slots 702 through the APB slave.

In this embodiment, the motherboard 700 has full 64-bit support. For instance, the combination of master and expansion connector supports 64-bit master, and the AHB slave and APB connectors may be combined to support a 64-bit AHB slave, a second 64-bit AHB master, and the like. Additionally, the APB connector may be used as a second 32-bit AHB slave.

Further, by providing a multi-layer AHB, all masters may talk to all slaves. A variety of other changes may be made to the motherboard 700 without departing from the spirit and scope of the present invention. For instance, common AHB FPGAs may be replaced with high speed CPLDs, EBIU and APB FPGAs may be combined into one Virtex-II, DDR Dram may use standard DIMMS, common memory and multi-ported (non DDR) memory may be included on the daughter cards for maximum flexibility, and the like as contemplated by a person of ordinary skill in the art. An additional block diagram illustrating a multi-ported system is shown in FIG. 7B.

Daughter Cards

Implementing IP in a FPGA daughter card may be accomplished with a minimum of effort through use of the present invention. Daughter card connection may be made standard AHB master, slave and APB, which are identical to an ASIC. The IP hierarchy may be extracted from the AHB bus down. Additionally, an FPGA specific top level may be added for bus connections, such as I/O pads, clocks, and the like, which may be implemented as a library function. Further, FPGA specific I/O may be added as needed for mezzanine interface. Partitions design across multiple FPGAs through use of the present invention. AHB RTLs may be prototyped in FPGAs as shown in FIG. 8A. Additionally, multiple cores may be provided in a single FPGA, as shown in FIG. 8B.

Daughter cards of the present invention may support a variety of functionality as desired to enable rapid prototyping. For example, an ARM922 daughter card may be provided which leverages an ARM922 test chip and provided full hardware support for JTAG based debugging. The ARM922 daughter card may include an AHB master interface to the motherboard, and operate as a standalone daughter card. An ARM 946/966 daughter card may also be provided having similar functionality but leverages an ARM946/966 test chip.

A daughter card may also be configured as a general purpose FPGA daughter card. This daughter card may include a general purpose FPGA to provide a wide range of desired functionality. Preferably, the interconnect will support AHB masters, AHB slaves and APB slaves. Additionally, connectors may be provided to allow a mezzanine card to be attached to provide a physical interface for further customization. A ZSP daughter card may also be provided with an interconnection which will support AHB masters, AHB slaves and APB slaves and connectors to a mezzanine card to allow Mezzanine cards may also be provided to enable physical level interfaces for daughter cards. For example, a telephony mezzanine card may be provided which contains TDM port to a voice codec and subscriber line interface circuits. The telephony mezzanine card may be utilized with the ZSP daughter card for an additional or other voice CODEC, echo cancellation, and other voice processing as contemplated by a person of ordinary skill in the art. The telephony card may also include a message processing unit (MPU) interface to control SLAC devices. Additionally, an Ethernet mezzanine card may also be provided to provide an Ethernet connection. The Ethernet mezzanine card may include 10/100 Ethernet ports and be used with general purpose FPGA daughter card as previously described. Use with the General Purpose FPGA daughter card may require Ethernet controller logic.

A motherboard of the present invention may support a variety of features. For example, the motherboard may include a power connector (2×25 pin 0.1 header) suitable for supporting +5, +3.3, +2.5, +1.8, +1.5, −12 and −5 V. The motherboard may also include a joint test action group (JTAG) connector (2×25 pin 0.1 header). The connector may support daisy chaining and for debugging JTAP signals, such as TDI, TDO, RTCK, TCK, TMS, nSRST, nTRST, DBGACK, and the like (DBGACK goes to APB FPGA to stop cntr, watchdog, and the like). The connector may support a 4-bit MB revision number; 2-bit slot ID; 8-bit jumper settings such as master only, slave only, and the like; FPGA present to inform reset circuitry of initialized device; FPGA done to inform reset circuitry that initialization is complete; and the like as contemplated by a person of ordinary skill in the art.

Communication

To achieve communication between devices utilizing the AHB, AHB master MUXs are provided. For instance, referring again to FIG. 4, four masters may be provided for each daughter card slot. The slot is enabled if HMAST[3:2]== Slot ID. One of the four masters is selected by HMAST[1:0], with the library function being a part of I/O of the FPGA daughter card for 1, 2, 3 or 4.

An ApArbiter is located in APB FPGA. A critical path is provided by HCLK to HMAST out of APB FPGA across the motherboard to common AHB interface FPGAs, which is preferably slower than control signal delays. For RTL changes, the ApArbiter outputs unregistered HMAST. Common AHB Interface FPGAs register the compare of HMAST [3:2] to slot ID, and actually register the enable of the IOB. Thus, timing problems are eliminated.

A centralized decoder may be utilized in APB FPGA for HSEL generation. For example, the decoder may generate 24 HSELs. Additional embodiments contemplate one copy of decoder distributed to all motherboard FPGAs, thereby allowing syntheses to use what it needs. Further, the decoder may be register based, so there is no need to change RTL to remap the system.

The configuration of an APB bridge may be provided in an number of ways. For example, a main APB bridge may be provided in an APB FPGA. The bridge may generate 16 daughter card PSELs on peripherals on the FPGA. A unidirectional data bus is provided to the daughter card slots from the APB FPGA. A secondary bridge is provided in the common memory FPGA, which connects ApSdramCtrl to the AHB bus.

Connectors which may be utilized in embodiments of the present invention are shown in FIGS. 9A, 9B and 9C. For instance, in FIG. 9A, AHB master connectors 900 & 902 are shown. In FIG. 9B, an AHB slave connector 904 is shown. In FIG. 9C, an APB connector 906 is shown.

Mapping an ASIC Utilizing the Rapid Prototyping System

Much of the delays and problems caused in bringing ASIC designs to market result from the difficulty in testing the design in a system environment early enough, and the need to "spin" silicon because of inadequate system tests. However, though use of the present invention, a development system is provided which allows a design to be prototyped in FPGA and system software integrated prior to tape out of the first silicon, increasing the probably that the first silicon meets the desired requirements.

For example, referring now to FIG. 10, an exemplary embodiment of the present invention is shown wherein an ASIC example is mapped into a system of the present invention. In this example, an ASIC is desired having Ethernet functionality. A motherboard 1002 is provided with commonly used memory system, such as SRAM 1006, SDRAM 1004, and the like and peripherals 1008, such as UARTS 1010, 1012 & 1014, interrupt controllers 1016, timers 1018, and the like.

To provide the processing for the prototype, three processor daughter cards 1020, 1022 & 1024 are utilized. Additional, a FPGA card is utilized to act as the Ethernet controller 1026. The cards 1020, 1022, 1024 & 1026 are communicatively coupled over a system bus, such as an advanced high performance bus (AHB) 1028 having an AHB arbiter 1030. A peripherals bus 132, such as an advanced peripherals bus, is provided for connecting the peripherals 1008. A bridge 134 links the system bus 1028 to the peripherals bus 1032. In this way, the system 1000 of the present invention may be utilized to prototype a design for an ASIC and thereby enable system software to be integrated prior to producing the design in silicon, thereby increasing the probability that the first silicon device produced will function as intended.

Thus, the present invention provides for a variety of advantages over the prior art. Concurrent multi-processing allows for prototyping multi-processor system such as dual ARM, ARM and ZSP, and the like, including support for multi-core debugging. Multi-ported memory environment allows prototyping of more than one master device, processor or bus master DMA type controller, accessing memory at the same time. AMBA bus connections matching the ASIC methodology flow allows a designer to take the RTL directly from an ASIC design, add a library file for FPGA I/O and synthesize directly into a FPGA. Processors and peripherals may be prototyped using either test silicon or FPGA. Common AHB bus allows prototyping of system where the peripherals and non-multi-ported memory on the motherboard are shared by any or all masters in the system. Additionally, a system may be made application specific by providing a needed subset of the features previously mentioned in the discussion.

Interface for Rapid Prototyping System

Software for a design may be developed utilizing a variety of methods, such as by using Virtio software (Virtio was filed for as a service mark of Simulation Magic Inc., Campbell, Calif.), models for the rapid prototyping system previously described, in the hardware on the rapid prototyping system itself, and the like. Previously, mixing the two environments so that part of the system may be physically implemented on the hardware, with the remainder virtually implemented on the modeling system, was not provided to a large extent. However, through use of the present invention, an interface is provided which allows these two environments to be merged, thereby permitting an efficient and inexpensive prototyping solution.

Referring now to FIG. 11, an exemplary embodiment of the present invention is shown wherein a rapid prototyping system includes a prototyping interface device having translating functionality to enable an information handling system to communicate with the rapid prototyping system utilizing system accesses. A rapid prototyping system 1100 includes a motherboard 1102 with common memory 1104. Daughter cards 1106 & 1110, such as processor cards, FPGA cards, and the like as previously described may be connected to the motherboard 1102 to provide prototyping functionality. The daughter cards 1106 & 1110 may be connected through an advanced microcontroller bus architecture (AMBA) advanced high-performance bus (AHB) to the motherboard to provide specific desired functionality. Additionally, the daughter cards may include mezzanine cards 1108 & 1112 for physical I/O connectivity, i.e. physical interfaces, for the daughter cards. Preferably, the specifications are standardized to enable a user to design and interchange components of the system, thereby providing a modular development system.

To provide a system that allows for physical implementation on the rapid prototyping system 1100 and virtual implementation on an information handling system 1114, a prototyping interface device 1116 is communicatively coupled to the information handling system 1114 and the rapid prototyping system 1100. For instance, the prototyping interface device 1116 may include at least one of a daughter card 1110 and mezzanine card 1112 connected to the rapid prototyping system 1100. Thus, the prototyping interface device 1116 may be configured to include a daughter card having logic necessary to translate communication from the information handling system 1114 and the rapid prototyping system 1100, although it should be realized that the prototyping interface device may assume a variety of configurations without departing from the spirit and scope of the present invention.

For example, referring now to FIG. 12, an exemplary embodiment of the present invention is shown wherein a prototyping interface device configured as a PCI card is shown. An information handling system 1200 includes a processing system 1202 for control of the information handling system 1200. For instance, the processing system 1202 may include a central processing unit such as a microprocessor or microcontroller for executing programs, performing data manipulations and controlling the tasks of the information handling system 1200. Additionally, the information handling system 1200 includes a memory 1204.

The memory 1204 is suitable for storing a program of instructions which may configure the processing system 1202 to perform desired tasks.

Communication with the processing system 1202 and memory 1204 may be implemented through a system bus 1206 for transferring information among the components of the information handling system 1200. The system bus 1206 may include a data channel for facilitating information transfer between storage and other peripheral components of the information handling system 1200. The system bus 1206 further provides the set of signals required for communication with processing system 1202 including a data bus, address bus, and control bus. The system bus 1206 may comprise any state of the art bus architecture according to promulgated standards. In this instance, the system bus 1206 is a peripheral component interconnect (PCI) local bus.

To facilitation communication between the information handling system 1200 and a rapid prototyping system 1210, a prototyping interface device 1208 is provided. The prototyping interface device 1208 is configured as a PCI board which plugs into the PCI bus of the information handling system 1200. The prototyping interface device 1208 includes the interface and logic necessary to communicate with between the rapid prototyping system 1210 and the information handling system 1200. For example, the prototyping interface device 1208 may be connected to a daughter card 1212 which is connected to the motherboard 1214, and may do so utilizing a variety of methods, such as directly through use of a cable, through a mezzanine card providing a physical I/O, and the like as contemplated by a person of ordinary skill in the art. Additionally, the prototyping interface device may itself include the daughter card 1212, the daughter card including the logic necessary to translate communications between the information handling system and the rapid prototyping system 1210.

Through use of the prototyping interface device 1208, the information handling system may provide resources in a virtual environment to be accessed by the physical environment of the rapid prototyping system 1210. For example, other daughter cards 1216, 1218 & 1220 communicatively coupled to the motherboard 1214 may request access to resources provided in a virtual environment of the information handling system 1200. Likewise, virtual resources implemented in the information handling system 1200 may request access to resources in the physical environment of the rapid prototyping system, such as the motherboard 1214 and daughter cards 1216, 1218 & 1220, and the functionality provided as previously described.

Therefore, designers are allowed to prototype desired hardware while modeling the rest of the system in software. Additionally, designers may model new features in software while accessing additional features from a hardware prototype of the rest of the system being designed.

The prototyping interface device may also provide a wide range of additional functionality. For example, the interface may be used to connect an information handling system to logic of the rapid prototyping system to be used for debugging the system. Thus, a PC based system level debugger or profiler may be provided instead of just a single processor. Additionally, the interface may be utilized as a PCI interface of an ASIC being prototyping on a rapid prototyping system that is being designed to be a PCI product once in silicon.

Referring now to FIG. 13, a hardware system in accordance with the present invention is shown. The hardware system shown in FIG. 13 is generally representative of the hardware architecture of an information handling system of the present invention. A controller, for example, a processing system 1302, controls the information handling system 1300. The processing system 1302 includes a central processing unit such as a microprocessor or microcontroller for executing programs, performing data manipulations and controlling the tasks of the information handling system 1300.

Communication with the processing system 1302 may be implemented through a system bus 1310 for transferring information among the components of the information handling system 1300. The system bus 1310 may comprise any state of the art bus architecture according to promulgated standards, for example industry standard architecture (ISA), extended industry standard architecture (EISA), Micro Channel Architecture (MCA), peripheral component interconnect (PCI) local bus, standards promulgated by the Institute of Electrical and Electronics Engineers (IEEE) including IEEE 488 general-purpose interface bus (GPIB), IEEE 696/S-600, and so on. Furthermore, the system bus 1310 may be compliant with any promulgated industry standard. For example, the system bus 1310 may be designed in compliance with any of the following bus architectures: Industry Standard Architecture (ISA), Extended Industry Standard Architecture (EISA), Micro Channel Architecture, Peripheral Component Interconnect (PCI), Universal Serial Bus (USB), Access bus, IEEE 1394, Apple Desktop Bus (ADB), Concentration Highway Interface (CHI), Fire Wire, Geo Port, or Small Computer Systems Interface (SCSI), for example.

Additionally, the information handling system 1300 includes a memory 1304. In one embodiment, memory 1304 is provided on SIMMs (Single In-line Memory Modules), while in another embodiment, memory 1304 is provided on DIMMs (Dual In-line Memory Modules), each of which plugs into suitable sockets provided on a motherboard holding many of the other components shown in FIG. 13. Memory 1304 includes standard DRAM (Dynamic Random-Access Memory), EDO (Extended Data Out) DRAM, SDRAM (Synchronous DRAM), or other suitable memory technology. Memory 1304 may also include auxiliary memory to provide storage of instructions and data that are loaded into the memory 1304 before execution. Auxiliary memory may include semiconductor based memory such as read-only memory (ROM), programmable read-only memory (PROM) erasable programmable read-only memory (EPROM), electrically erasable read-only memory (EEPROM), or flash memory (block oriented memory similar to EEPROM).

The information handling system 1300 may further include a network connection device 1306. The network connection device 1306 communicates between the information handling system 1300 and a remote device, such as external devices, networks, information sources, or host systems that administer a plurality of information handling systems. For example, host systems such as a server or information handling system, may run software controlling the information handling system, serve as storage for an information handling system, or coordinate software running separately on each information handling system. The network connection device 1306 may provide or receive analog, digital, or radio frequency data. The network connection device 1306 preferably implements industry promulgated architecture standards, including Recommended Standard 232 (RS-232) promulgated by the Electrical Industries Association, Infrared Data Association (IrDA) standards, Ethernet IEEE 802 standards (e.g., IEEE 802.3 for broadband and baseband networks, IEEE 802.3z for Gigabit Ethernet, IEEE 802.4 for token passing bus networks, IEEE 802.5 for token ring networks, IEEE 802.6 for metropolitan area networks, 802.66 for wireless networks, and so on), Fibre Channel, digital subscriber line (DSL), asymmetric digital subscriber line (ASDL), frame relay, asynchronous transfer mode (ATM), integrated digital services network (ISDN), personal communications services (PCS), transmission control protocol/Internet protocol (TCP/IP), serial line Internet protocol/point to point protocol (SLIP/PPP), Universal Serial Bus (USB), and so on. For example, the network connection device 1306 may comprise a network adapter, a serial port, parallel port, printer adapter, modem, universal asynchronous receiver-transmitter (UART) port, and the like, or use various wireless technologies or links such as an infrared port, radio-frequency (RF) communications adapter, infrared transducers, or RF modem.

The information handling system 1300 further includes a display system 1312 for connecting to a display device 1314. The display system 1312 may comprise a video display adapter having all of the components for driving the display device, including video random access memory (VRAM), buffer, and graphics engine as desired. The display device 1314 may comprise a liquid-crystal display (LCD), or may comprise alternative type of display technologies, such as a light-emitting diode (LED) display, gas or plasma display, or employ flat-screen technology.

An information handling system 1300 may further include an input/output (I/O) system 1316 for connecting to one or more I/O devices 1318, 1320 up to N number of I/O devices 1322. Input/output system 1316 may comprise one or more controllers or adapters for providing interface functions between one or more of I/O devices 1318–1322. For example, input/output system 1316 may comprise a serial port, parallel port, network adapter, printer adapter, radio-frequency (RF) communications adapter, universal asynchronous receiver-transmitter (UART) port, and the like., for interfacing between corresponding I/O devices such as a mouse, joystick, trackball, trackpad, trackstick, infrared transducers, printer, modem, RF modem, bar code reader, charge-coupled device (CCD) reader, scanner, compact disc (CD), compact disc read-only memory (CD-ROM), digital versatile disc (DVD), video capture device, touch screen, stylus, electroacoustic transducer, microphone, speaker, and the like. It should be appreciated that modification or reconfiguration of the information handling system 1300 of FIG. 13 by one having ordinary skill in the art would not depart from the scope or the spirit of the present invention.

Although the invention has been described with a certain degree of particularity, it should be recognized that elements thereof may be altered by persons skilled in the art without departing from the spirit and scope of the invention. One of the embodiments of the invention can be implemented as sets of instructions resident in the memory 1304 of one or more information handling systems configured generally as described in FIG. 13. Until required by the information handling system, the set of instructions may be stored in another readable memory device, for example in a hard disk drive or in a removable memory. Further, the set of instructions can be stored in the memory of an information handling system and transmitted over a local area network or a wide area network, such as the Internet, when desired by the user. Additionally, the instructions may be transmitted over a network in the form of an applet that is interpreted or compiled after transmission to the computer system rather than prior to transmission. One skilled in the art would appreciate that the physical storage of the sets of instructions or applets physically changes the medium upon which it is stored electrically, magnetically, chemically, physically, optically or holographically so that the medium carries computer readable information.

It is believed that the system and method of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A system for prototyping an integrated circuit, comprising:
    a motherboard having a plurality of connectors suitable for receiving daughter cards, the plurality of connectors being communicatively coupled to the plurality of daughter cards over a bus, the motherboard including at least one APB FPGA, each APB FPGA including a copy of a centralized decoder, the centralized decoder being register-based;
    a plurality of modular daughter cards communicatively coupled to the motherboard utilizing the plurality of connectors, the daughter cards modeling hardware of an integrated circuit design;
    an information handling system providing a virtual software modeling environment for an integrated circuit design;
    a mezzanine card suitable for communicatively coupling to at least one daughter card of the plurality of daughter cards, wherein the mezzanine card provides physical I/O connectivity to the at least one daughter card: and
    a prototyping interface device communicatively coupled to an information handling system and communicatively coupled to motherboard, the prototyping interface device including logic to translate communications between the information handling system and the motherboard,
    wherein the motherboard, plurality of daughter cards, prototyping interface device and information handling system are configured as a hardware and software integrated circuit emulation platform for at least one of testing software and system integration of an integrated circuit emulated by the motherboard, the information handling system, prototyping interface device and the plurality of daughter cards allowing for accesses to resources requested in the virtual software model environment implemented by the information handling system to take place in a physical environment of the motherboard and plurality of daughter cards, and further allowing for accesses to resources requested in the physical environment to take place in the virtual environment implemented by the information handling system,
    wherein the prototyping interface device includes an interface connected to the information handling system and a daughter card connected to the motherboard, the daughter card including logic to translate communication from the information handling system to system access on the bus matching the ASIC AMBA bus environment.

2. The system as described in claim 1, wherein the motherboard includes multi-ported memory capability as a shared resource to the plurality of connectors of the motherboard.

3. The system as described in claim 1, wherein the plurality of connectors of the motherboard have a common advanced high-performance bus (AHB).

4. The system as described in claim 1, wherein the plurality of connectors support concurrent multi-processing on the motherboard.

5. A system for prototyping an integrated circuit, comprising:
- a motherboard having a plurality of connectors suitable for receiving daughter cards, the plurality of connectors being communicatively coupled to the plurality of daughter cards over a bus matching an ASIC AMBA bus environment, the motherboard including at least one APB FPGA, each APB FPGA including a copy of a centralized decoder, the centralized decoder being register-based;
- a plurality of modular daughter cards communicatively coupled to the motherboard utilizing the plurality of connectors;
- an information handling system providing a virtual software modeling environment for an integrated circuit design;
- a mezzanine card suitable for communicatively coupling to at least one daughter card of the plurality of daughter cards, wherein the mezzanine card provides physical I/O connectivity to the at least one daughter card: and
- a prototyping interface device communicatively coupled to an information handling system and communicatively coupled to motherboard, the prototyping interface device including logic to translate communications between the information handling system and the motherboard,
- wherein the motherboard, plurality of daughter cards, prototyping interface device and information handling system are configured as a hardware and software integrated circuit emulation platform for at least one of testing software and system integration of an integrated circuit emulated by the motherboard, the information handling system, prototyping interface device and the plurality of daughter cards,
- wherein the prototyping interface device includes an interface connected to the information handling system and a daughter card connected to the motherboard, the daughter card including logic to translate communication from the information handling system to system access on the bus matching the ASIC AMBA bus environment.

6. The system as described in claim 5, wherein the motherboard includes multi-ported memory capability as a shared resource to the plurality of connectors of the motherboard.

7. The system as described in claim 5, wherein the plurality of connectors of the motherboard have a common advanced high-performance bus (AHB).

8. The system as described in claim 5, wherein the plurality of connectors support concurrent multi-processing on the motherboard.

9. The system as described in claim 5, wherein the daughter cards are modular.

10. A system for prototyping an integrated circuit, comprising:
- a motherboard having a plurality of connectors suitable for receiving daughter cards, the motherboard including a multi-ported memory capability as a shared resource to the plurality of connectors of the motherboard, the motherboard including at least one APB FPGA, each APB FPGA including a copy of a centralized decoder, the centralized decoder being register-based;
- a plurality of modular daughter cards communicatively coupled to the motherboard utilizing the plurality of connectors;
- an information handling system providing a virtual software modeling environment for an integrated circuit design;
- a mezzanine card suitable for communicatively coupling to at least one daughter card of the plurality of daughter cards, wherein the mezzanine card provides physical I/O connectivity to the at least one daughter card: and
- a prototyping interface device communicatively coupled to an information handling system and communicatively coupled to motherboard, the prototyping interface device including logic to translate communications between the information handling system and the motherboard,
- wherein the motherboard, plurality of daughter cards, prototyping interface device and information handling system are configured as a hardware and software integrated circuit emulation platform for at least one of testing software and system integration of an integrated circuit emulated by the motherboard, the information handling system, prototyping interface device and the plurality of daughter cards,
- wherein the prototyping interface device includes an interface connected to the information handling system and a daughter card connected to the motherboard, the daughter card including logic to translate communication from the information handling system to system access on the bus matching the ASIC AMBA bus environment.

11. The system as described in claim 10, wherein plurality of connectors are communicatively coupled to the plurality of daughter cards over a bus matching an ASIC AMBA bus environment.

12. The system as described in claim 10, wherein the plurality of connectors of the motherboard have a common advanced high-performance bus (AHB).

13. The system as described in claim 10, wherein the plurality of connectors support concurrent multi-processing on the motherboard.

14. The system as described in claim 10, wherein the daughter cards are modular.

15. A system for prototyping an integrated circuit, comprising:
- a motherboard having a plurality of connectors suitable for receiving daughter cards, the plurality of connectors of the motherboard having a common advanced high-performance bus (AHB), the motherboard including at least one APB FPGA, each APB FPGA including a copy of a centralized decoder, the centralized decoder being register-based;
- a plurality of modular daughter cards communicatively coupled to the motherboard utilizing the plurality of connectors;
- an information handling system providing a virtual software modeling environment for an integrated circuit design;
- a mezzanine card suitable for communicatively coupling to at least one daughter card of the plurality of daughter cards, wherein the mezzanine card provides physical I/O connectivity to the at least one daughter card: and
- a prototyping interface device communicatively coupled to an information handling system and communicatively coupled to motherboard, the prototyping interface device including logic to translate communications between the information handling system and the motherboard, wherein the motherboard, plurality of daughter cards, prototyping interface device and information handling system are configured as a hardware and software integrated circuit emulation platform for at least one of testing software and system integration of an integrated circuit emulated by the motherboard, the information handling system, prototyping interface device and the plurality of daughter cards, wherein the prototyping interface device includes an interface connected to the information handling system and a daughter card connected to the motherboard, the daughter card including logic to translate communication from the information handling system to system access on the bus matching the ASIC AMBA bus environment.

16. The system as described in claim 15, wherein the motherboard includes multi-ported memory capability as a shared resource to the plurality of connectors of the motherboard.

17. The system as described in claim 15, wherein the plurality of connectors of connectors are communicatively coupled to the plurality of daughter cards over a bus matching an ASIC AMBA environment.

18. The system as described in claim 15, wherein the plurality of connectors support concurrent multi-processing on the motherboard.

19. The system as described in claim 15, wherein the daughter cards are modular.

* * * * *